(12) United States Patent
Hynecek

(10) Patent No.: US 7,075,575 B2
(45) Date of Patent: Jul. 11, 2006

(54) GATED VERTICAL PUNCH THROUGH DEVICE USED AS A HIGH PERFORMANCE CHARGE DETECTION AMPLIFIER

(75) Inventor: Jaroslav Hynecek, Richardson, TX (US)

(73) Assignee: Isetex, Inc., Allen, TX (US)

( * ) Notice: Subject to any disclaimer, the term of this patent is extended or adjusted under 35 U.S.C. 154(b) by 1070 days.

(21) Appl. No.: 09/874,032

(22) Filed: Jun. 6, 2001

(65) Prior Publication Data
US 2002/0054225 A1 May 9, 2002

Related U.S. Application Data

(60) Provisional application No. 60/245,942, filed on Nov. 6, 2000.

(51) Int. Cl.
H04N 3/14 (2006.01)
H01L 27/148 (2006.01)
H01L 27/00 (2006.01)

(52) U.S. Cl. ............... 348/294; 257/230; 250/208.1
(58) Field of Classification Search ............... 257/230
See application file for complete search history.

(56) References Cited

U.S. PATENT DOCUMENTS 4,977,584 A * 12/1990 Kohno et al. ............... 348/296
5,625,210 A * 4/1997 Lee et al. ................... 257/292
5,872,371 A * 2/1999 Guidash et al. ............. 257/230
5,904,493 A * 5/1999 Lee et al. ................... 257/292
6,111,281 A * 8/2000 Isogai ........................ 257/292
6,580,106 B1 * 6/2003 Hynecek .................... 257/223
6,617,562 B1 * 9/2003 Mann ....................... 250/208.1
6,768,149 B1 * 7/2004 Mann et al. ............. 250/208.1

FOREIGN PATENT DOCUMENTS

JP 61-188965 * 8/1986

* cited by examiner

Primary Examiner—Tuan Ho
Assistant Examiner—Nhan T. Tran
(74) Attorney, Agent, or Firm—John E. Vandigriff

(57) ABSTRACT

A charge detection system used in an image sensor consists of the vertical punch through transistor with the gate surrounding its source and connected to it. The charge detector has a large conversion gain, high dynamic range, low reset feed through, and low noise. It senses charge nondestructively, which avoids generation of kTC noise. Additional embodiments of the invention include a standard reset gate option, a resistive reset gate option, and a lateral punch through transistor reset option to minimize the reset feed through. The charge detection system can be used in all know CCD image sensor architectures as well as in most CMOS image sensor architectures.

11 Claims, 2 Drawing Sheets

GATED VERTICAL PUNCH THROUGH DEVICE USED AS A HIGH PERFORMANCE CHARGE DETECTION AMPLIFIER

PRIORITY

Priority is claimed from Provisional application Ser. No. 60/245,942, filed Nov. 6, 2000.

FIELD OF THE INVENTION

The present invention relates to solid-state image sensors, and more particularly to charge detection amplifiers of image sensors that employ a vertical punch through transistor for sensing charge.

BACKGROUND OF THE INVENTION

A typical image sensor senses light by converting impinging photons into electrons that are integrated (collected) in the sensor pixels. After the integration cycle is completed, charge is converted into a voltage that is supplied to the output terminals of the sensor. The charge to voltage conversion is accomplished either directly in the sensor pixels, such as in the Active Pixel CMOS image sensors, or remotely off the sensing area, in charge conversion amplifiers. The key element of every charge conversion amplifier is the charge detection node. As charge is transferred onto the node, its potential changes in proportion to the amount of transferred charge and this represents the signal. The charge detection node is typically connected to a gate of a suitable MOS transistor that serves as the first stage of the amplifier. The charge detection node is also provided with a reset means that removes charge from the node after sensing.

There are many charge detection node and amplifier designs known in the literature. The most popular structure is the Floating Diffusion (FD) architecture. The detail description of such systems can be found, for example, in the book: "Solid-State Imaging with Charge-Coupled Devices" by Albert J. P. Theuwissen pp. 76–79 that was published in 1995 by Kluwer Academic Publishers.

Another type of charge detection concept is based on the Floating Gate (FG) architecture. The relatively recent description of this concept has appeared in the article: "Low-Noise and High-Speed Charge Detection in High-resolution CCD Image Sensors" by Hynecek, published in IEEE Transactions on Electron Devices vol. 44 No. 10 Oct. 1997. However, the most promising design of the charge detection system, that has high performance and is very compact, is the BCD charge detection amplifier described in U.S. Pat. No. 5,546,438 to Hynecek. In this system, charge that moves in the bulk of the semiconductor in a CCD channel modulates the threshold of a transistor that overlies the channel.

The performance of each charge detection system can be compared and evaluated according to the following main criteria: the charge conversion factor, dynamic range, noise, reset feed-through, and linearity. The charge conversion factor is determined by the over all detection node capacitance that also includes the node parasitic capacitances. It is thus desirable to minimize the parasitic capacitances and maximize the charge conversion factor. The Dynamic Range (DR) of the node is determined by the ratio of maximum charge handling capacity to the noise floor. It is desirable to minimize the noise floor in order to maximize the DR.

All the known charge detection readout concepts can be divided into two categories: the charge detection readouts that sense charge destructively and the nondestructive charge readouts. The destructive charge readout nodes typically reset charge to a predetermined reference level, which causes generation of kTC noise. kTC noise may be removed from the signal later by a complicated CDS signal processing method. The non-destructive charge readouts, on the other hand, remove all charge from the node thus resetting the node to zero and avoiding the generation of kTC noise. The nondestructive charge readout is preferable in high-speed applications, since this simplifies the signal processing, which ultimately leads to a superior performance.

An example of the nondestructive charge readout is the BCD concept illustrated in FIG. 1. In this structure the charge detection node is integrated together with the first stage amplifier transistor to a single compact device. This eliminates many parasitic capacitances that would normally result from interconnects between the node, the reset means, and the amplifier input transistor. Another advantage of this structure is its low reset feed through. This is due to the fact that the reset gate couples strongly only to the MOS transistor gate that is bypassed to ground.

However, the BCD charge detection system has also some disadvantages. The main problem is the low conversion gain described by the formula $Gc=q/(2*Cg)$. The factor 2 appearing in the denominator significantly reduces the conversion gain and makes it less competitive with more conventional structures. The second significant problem is the current carrying capacity of the overlying MOS transistor. The current is limited by a complicated channel potential profile design and cannot be sufficiently increased to lower the transistor Johnson noise. This problem increases the amplifier noise floor and limits the detection of low-level signals. The third problem of the BCD designs is its DR. The complicated channel potential profile also limits the amount of charge that can be handled by the structure, which in turn limits the available output voltage swing. The BCD detector also exhibits some non-linearity in charge to voltage transfer characteristic, however, this does not seem to be very important in systems where the output signal is digitized and processed using DSP techniques.

SUMMARY OF THE INVENTION

The invention provides a practical non-destructive charge detection readout system whose charge conversion factor is high, whose noise floor is reduced by using a sufficiently high channel current in the sensing transistor, and provides a practical high performance charge detection node whose charge handling capacity is high resulting in high DR and large output voltage swing.

A Vertical Punch Through (VPT) transistor is incorporated into the charge signal channel and surrounds the source of the transistor which is provided with a gate connected to its source. This increases the charge detection sensitivity, dynamic range, and reduces noise.

DETAILED DESCRIPTION OF PREFERRED EMBODIMENTS

Figure 1:
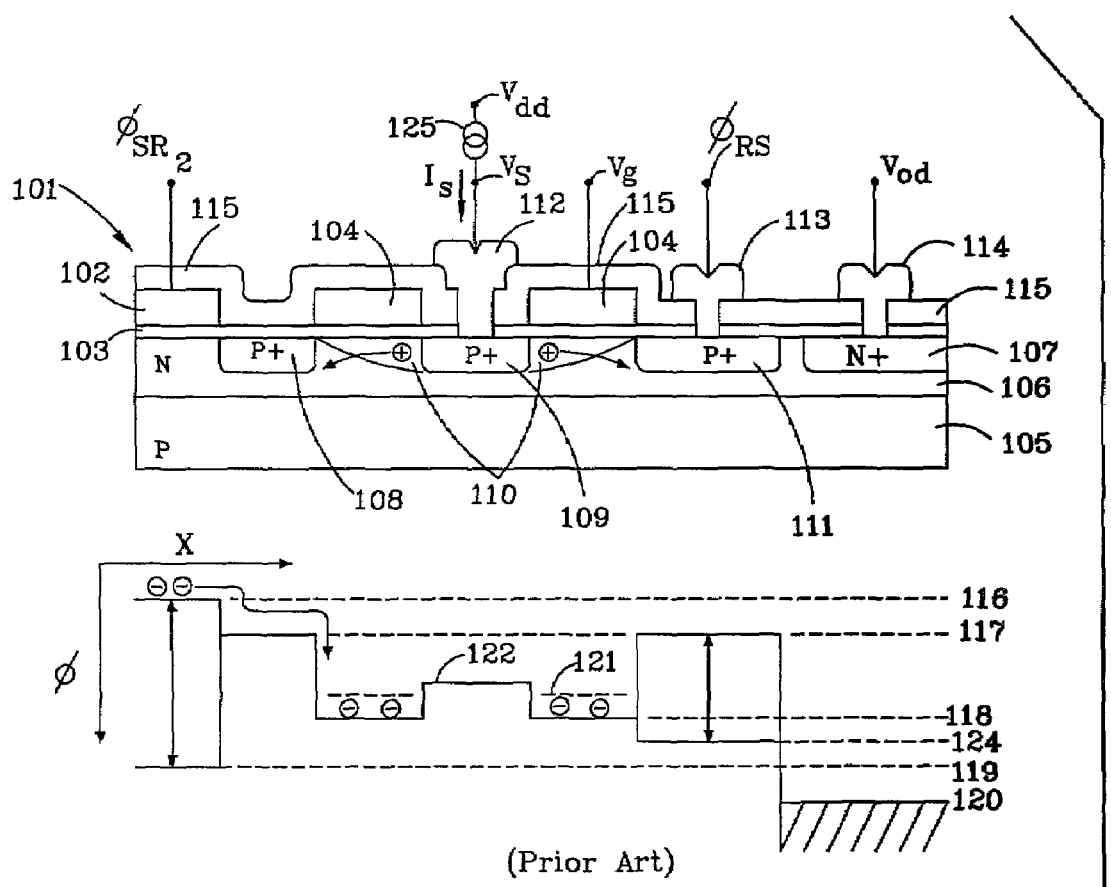
FIG. 1 is a cross sectional view of a prior art BCD charge detection device, with corresponding potential profiles, in which hole current of the p-channel transistor, that overlies the CCD channel, flows laterally along the gate of the transistor.

In FIG. 1, a cross section 101 of the typical prior art BCD charge detection node is shown together with the corresponding potential profiles. The p-type doped substrate is indicated as the region 105 that includes an n-type doped buried channel 106 near its surface. Additional p+ type doped regions 108, 109, and 111 have been diffused or implanted into the structure as shown in FIG. 1. The n+ type doped region 107 serves as the output diode that collects charge after sensing and reset. A suitable dielectric layer 103, for example silicon dioxide, separates the substrate from gates 102 and 104. Another dielectric layer 115 may be deposited over the structure to provide the necessary isolation before metal interconnects 112, 113, and 114 are formed. The gate 104 has a doughnut shape and completely surrounds the region 109 that serves as source of the p channel MOS transistor. The drain of this transistor is also circular in shape and is formed by regions 108, 111 and by channel stops not visible in FIG. 1. The MOS transistor (109,110,111) is turned on by biasing the gate 104 to a suitable potential, for example ground, and by supplying current $I_s$ to source 109 from the current source 125 through the metal interconnect lead 112. The current that consist of holes 110 flows along the surface of the structure under gate 104 from source 109 to drain 108 and 111. As charge 121 is transferred under the structure by clocking the gate 102 from level 119 to level 116, its potential profile 118 changes, which results in change of the source potential $V_s$ 122. This change is further processed and buffered by suitable amplifiers and delivered to the sensor output terminals as the desired signal. Charge is removed from the node by applying a pulse to the resistive reset gate 111. This changes potential under this gate from level 117 to level 124 and allows charge to flow to the output diode region 107 that is biased at the level 120. This action removes all charge from the node, which causes the node potential to return to its original profile without any error and kTC noise generation.

The main problems typically encountered when implementing the BCD concept are: the low conversion gain given by the formula Gc=q/(2*Cg) where q is electron charge and Cg is the MOS transistor gate capacitance, low hole current 110, and low charge handling capacity determined by the potential difference between levels 122 and 118.

Figure 2:
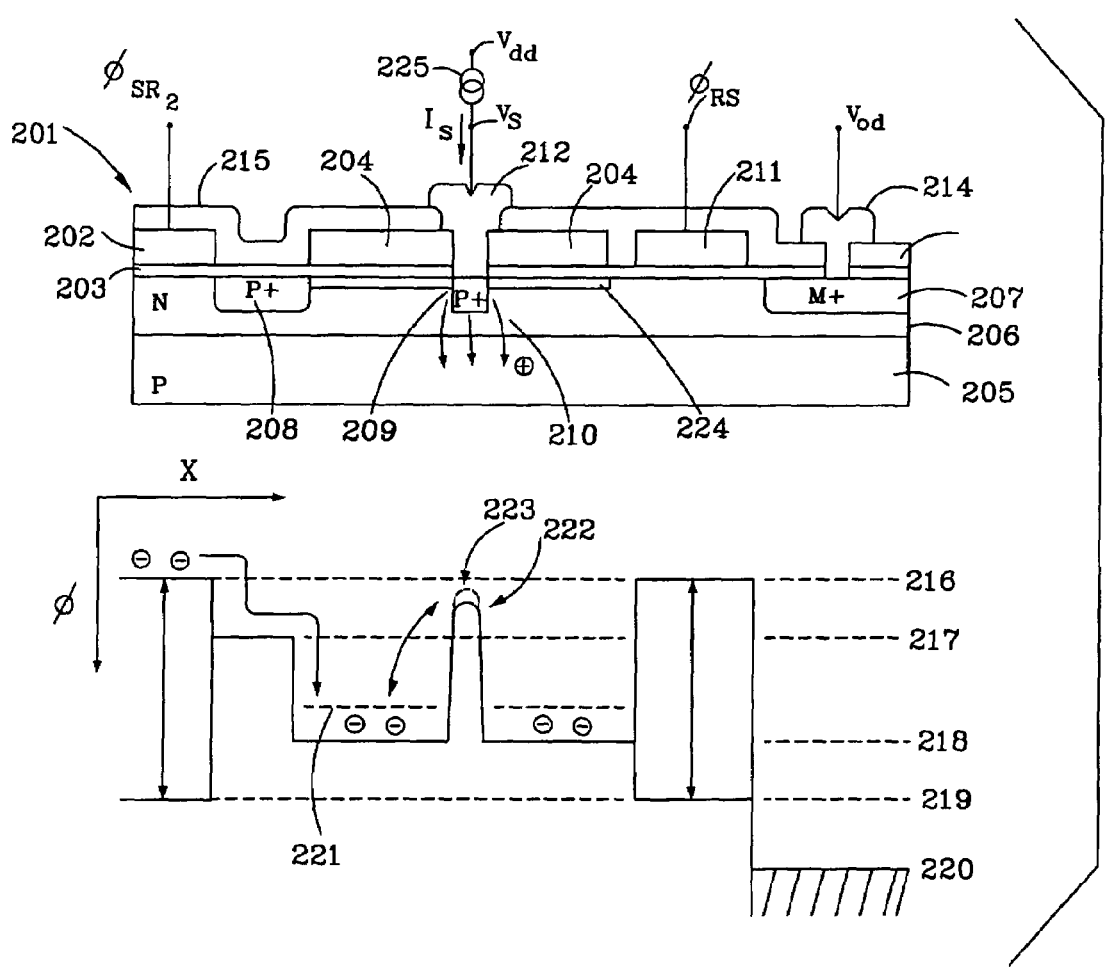
FIG. 2 is a cross sectional view of the device of the present invention, with the corresponding potential profiles, where the hole current flows in a direction vertical to substrate.

The device of the present invention is shown in cross 201 section in FIG. 2. This embodiment of the invention eliminates problems encountered with the BCD structure. In FIG. 2 the regions 202 through 215 correspond to the same regions 102 through 115 of drawing in FIG. 1. The key differences to note, however, are as follows. The holes 210 do not flow laterally under the gate but flow now in the vertical direction from source 209 to substrate 205. Another difference is the reset gate 211. A standard reset gate 211 has replaced the resistive reset gate 111 in FIG. 1. This is possible now since there is no need to form a completely enclosed drain around the BCD MOS transistor. The last and the most significant difference is that gate 204 is connected to source 209 through the common metal interconnection 212. This feature provides a positive feedback in the structure that improves the conversion gain. A suitable implant 224 may be placed under the gate 204 to adjust the threshold for the vertical current flow.

The operation of the present invention is similar to the BCD operation. By applying a clocking signal to gate 202, changes potential under gate 202 from level 219 to level 216 and transports charge 221 into the detection node. The presence of charge lowers the potential barrier 222 to level 223. Correspondingly, as the potential barrier 222 changes so does the barrier for injection of holes from source 209 to substrate. The onset of hole current is called the Vertical Punch Through (VPT) effect. The punch through barrier height depends on the gate potential, on the amount of electron charge under the gate, and on the width of the p+ type doped region 209. When a constant current $I_s$ is supplied to source 209 from the current source 225 through the metal interconnection 212, the presence of charge in the structure causes potential of the source Vs to change. This is the desired signal that can be further buffered and delivered to the sensor output terminals. The node reset is accomplished by applying a pulse to reset gate 211 that causes potential under this gate to momentarily change from level 216 to level 219. This action removes charge 221 from the node and allows it to flow to the drain 207 that is biased at the level 220. Other reset devices can also be used with this structure. The resistive gate 111 shown in FIG. 1 would work here equally well. It is also possible to use the lateral punch through transistor that would further minimize the node reset feed through. All these reset structure alternatives are well known to those skilled in the art and will not be discussed here in any further detail.

Advantages of using the VPT device for charge detection in CCD and CMOS image sensors are as flows: The VPT device has larger charge conversion factor due to its compact size and positive feedback resulting from the gate being connected to source of the VPT transistor. Much larger current can flow in the vertical direction than previously in the lateral direction of BCD structure. This feature significantly reduces Johnson noise and correspondingly lowers the noise floor of the sensor. The charge readout is nondestructive, which does not introduce kTC noise. Much larger well capacity is available as determined by the potential difference between levels 218 and 217. This results in large output swing and higher DR. Finally, the low reset feed through is maintained in this structure, since the gate strongly couples only to the low impedance node 204. If further reset feed through reduction is required, a lateral punch through reset device can be used.

Having described preferred embodiments of the novel charge detection amplifier with high conversion gain, high DR, low feed through, and low noise, which are intended to be illustrative and not limiting, it is noted that modifications and variations can be made by persons skilled in the art in light of the above teachings. It is therefore to be understood that changes may be made in the particular embodiments of the invention disclosed which are within the scope and spirit of the invention as defined by the appended claims.

What is claimed:

1. A charge detection device for use in an image sensor, said charge detection device including a vertical punch-through transistor having a gate surrounding a source, wherein the gate is conductively connected to the source.

2. The device according to claim 1, wherein a charge present under the gate modulates a punch through potential barrier of the vertical punch-through transistor.

3. The device according to claim 2, including a charge reset means adjacent to and coupled to the vertical punch-through transistor to remove charge therefrom.

4. A CMOS device comprising:

an image sensor; and a charge detection device in said image sensor including a vertical punch-through transistor having a gate surrounding a source, wherein the gate is conductively connected to the source.

5. The device according to claim 4, wherein a charge present under the gate modulates a punch through potential barrier of the vertical punch-through transistor.

6. The device according to claim 5, including a charge reset means adjacent to and coupled to the vertical punch-through transistor to remove charge therefrom.

7. The device according to claim 6, wherein the charge reset means is an MOS reset gate.

8. A CCD device comprising:

an image sensor; and a charge detection device in said image sensor including a vertical punch-through transistor having a gate surrounding a source, wherein the gate is conductively connected to the source.

9. The device according to claim 8, wherein a charge present under the gate modulates a punch through potential barrier of the vertical punch-through transistor.

10. The device according to claim 9, including a charge reset means adjacent to and coupled to the vertical punch-through transistor to remove charge therefrom.

11. The device according to claim 10, wherein the charge reset means is an MOS reset gate.

* * * * *